United States Patent
Hong et al.

(10) Patent No.: US 11,136,651 B2
(45) Date of Patent: Oct. 5, 2021

(54) ZN-MG ALLOY PLATED STEEL MATERIAL HAVING EXCELLENT CORROSION RESISTANCE AND PLATING ADHESION

(71) Applicant: POSCO, Pohang-si (KR)

(72) Inventors: Seok-Jun Hong, Gwangyang-si (KR); Young-Do Kim, Seoul (KR); Woo-Sung Jung, Gwangyang-si (KR); Hyun-Woo Kim, Seoul (KR); Jong-Min Byun, Seoul (KR); Su-Ryong Bang, Seoul (KR); Tae-Yeob Kim, Gwangyang-si (KR)

(73) Assignee: POSCO, Pohang-si (KR)

( * ) Notice: Subject to any disclaimer, the term of this patent is extended or adjusted under 35 U.S.C. 154(b) by 0 days.

(21) Appl. No.: 16/470,744

(22) PCT Filed: Dec. 22, 2017

(86) PCT No.: PCT/KR2017/015404
§ 371 (c)(1),
(2) Date: Jun. 18, 2019

(87) PCT Pub. No.: WO2018/117760
PCT Pub. Date: Jun. 28, 2018

(65) Prior Publication Data
US 2019/0345584 A1  Nov. 14, 2019

(30) Foreign Application Priority Data
Dec. 23, 2016  (KR) ........................ 10-2016-0177355

(51) Int. Cl.
*B32B 15/01*  (2006.01)
*C22C 18/00*  (2006.01)
(Continued)

(52) U.S. Cl.
CPC ............ *C22C 18/00* (2013.01); *B32B 15/013* (2013.01); *B32B 15/04* (2013.01); *B32B 15/043* (2013.01);
(Continued)

(58) Field of Classification Search
CPC ......... C25D 3/22; C23C 18/00; C23C 14/025; C23C 14/5806; C23C 14/16;
(Continued)

(56) References Cited

U.S. PATENT DOCUMENTS

2013/0143095 A1  6/2013  Takagi et al.
2013/0316192 A1  11/2013  Stellnberger et al.
(Continued)

FOREIGN PATENT DOCUMENTS

CN  103384729  11/2013
CN  103498086  1/2016
(Continued)

OTHER PUBLICATIONS

Byun, et al., "Effect of heat treatment on corrosion resistance and adhesion property in Zn—Mg—Zn multi-layer coated steel sheet prepared by PVD process," Surface Coatings Technology, (Oct. 15, 2016), pp. 1-5. (Year: 2016).*

(Continued)

*Primary Examiner* — Michael E. La Villa
(74) *Attorney, Agent, or Firm* — Cantor Colburn LLP

(57) ABSTRACT

Provided is a Zn—Mg alloy plated steel material comprising: a base steel material; and first to third Zn—Mg alloy layers sequentially formed on the base steel material, wherein the first to third Zn—Mg alloy layers have a Zn single phase, a Mg single phase, a $MgZn_2$ alloy phase, and a $Mg_2Zn_{11}$ alloy phase, an area rate of the $MgZn_2$ alloy phase included in the first to third Zn—Mg alloy layers is larger than an area rate of the $Mg_2Zn_{11}$ alloy phase included (Continued)

in the first to third Zn—Mg alloy layers, and an area rate of a MgZn$_2$ alloy phase included in each of the first to third Zn—Mg alloy layers is larger than an area rate of a MgZn$_2$ alloy phase included in the second Zn—Mg alloy layer.

4 Claims, 7 Drawing Sheets

(51) Int. Cl.
| | |
|---|---|
| C23C 2/06 | (2006.01) |
| C23C 14/16 | (2006.01) |
| C25D 3/22 | (2006.01) |
| C23C 14/02 | (2006.01) |
| C23C 14/58 | (2006.01) |
| C23C 2/28 | (2006.01) |
| C23C 2/26 | (2006.01) |
| C23C 2/02 | (2006.01) |
| C23C 2/40 | (2006.01) |
| C23C 28/02 | (2006.01) |
| B32B 15/04 | (2006.01) |
| C23C 14/54 | (2006.01) |
| B32B 15/18 | (2006.01) |
| C23C 30/00 | (2006.01) |

(52) U.S. Cl.
CPC ............... *B32B 15/18* (2013.01); *C23C 2/02* (2013.01); *C23C 2/06* (2013.01); *C23C 2/26* (2013.01); *C23C 2/28* (2013.01); *C23C 2/40* (2013.01); *C23C 14/024* (2013.01); *C23C 14/025* (2013.01); *C23C 14/027* (2013.01); *C23C 14/16* (2013.01); *C23C 14/165* (2013.01); *C23C 14/54* (2013.01); *C23C 14/541* (2013.01); *C23C 14/5806* (2013.01); *C23C 28/023* (2013.01); *C23C 28/025* (2013.01); *C23C 30/00* (2013.01); *C23C 30/005* (2013.01); *C25D 3/22* (2013.01); *Y10T 428/12729* (2015.01); *Y10T 428/12785* (2015.01); *Y10T 428/12792* (2015.01); *Y10T 428/12799* (2015.01); *Y10T 428/12972* (2015.01); *Y10T 428/12979* (2015.01)

(58) Field of Classification Search
CPC ... C23C 14/027; C23C 14/024; C23C 14/165; C23C 14/541; C23C 14/54; C23C 2/28; C23C 2/26; C23C 2/06; C23C 2/02; C23C 2/40; C23C 28/023; C23C 28/025; C23C 30/00; C23C 30/005; B32B 15/013; B32B 15/04; B32B 15/043; B32B 15/18; Y10T 428/12795; Y10T 428/12792; Y10T 428/12729; Y10T 428/12799; Y10T 428/12972; Y10T 428/12979; Y10T 428/12785; C22C 18/00

See application file for complete search history.

(56) References Cited

U.S. PATENT DOCUMENTS

| | | |
|---|---|---|
| 2015/0352812 A1 | 12/2015 | Jung et al. |
| 2019/0100831 A1 | 4/2019 | Oh et al. |

FOREIGN PATENT DOCUMENTS

| | | |
|---|---|---|
| JP | 03039489 | 2/1991 |
| JP | 08081761 | 3/1996 |
| JP | 09228030 | 9/1997 |
| JP | H10081993 | 3/1998 |
| JP | 2000064011 | 2/2000 |
| JP | 2002275611 | 9/2002 |
| JP | 2010242173 | 10/2010 |
| JP | 2010275633 | 12/2010 |
| JP | 2010275634 | 12/2010 |
| KR | 100775241 | 11/2007 |
| KR | 100833073 | 5/2008 |
| KR | 20140083836 | 7/2014 |
| KR | 101483836 | 1/2015 |
| KR | 20160078912 | 7/2016 |
| WO | 2012091385 | 7/2012 |
| WO | WO 2013/091889 | * 6/2013 |

OTHER PUBLICATIONS

European Search Report—European Application No. EP 17883028.7 dated Jan. 24, 2020, citing EP 2940191, KR 2016-0078912, and WO 2012/091385.

Byun, et al., Effect of heat treatment on corrosion resistance and adhesion property in Zn—Mg—Zn multi-layer coated prepared by PVD process, Surface & Coatings Technology, 2016, pp. 1-5, (Oct. 15, 2016).

International Search Report—PCT/KR2017/015404 dated Apr. 3, 2018.

Chinese Office Action—Chinese Application No. 201780080007.0 dated Oct. 10, 2020, citing Byun, et al., WO 2013/091889, KR 10-1483836, JP 2010-275633, JP 2010-242173, KR 10-0833073, KR 10-0775241, JP H10-81993, CN 103498086, and CN 103384729.

* cited by examiner

Fig. 2

| SALT SPRAY TIME | CON | COM 1 | COM 2 | COM 3 | INV 1 | COM 5 | COM 6 | COM 7 | COM 8 | COM 9 |
|---|---|---|---|---|---|---|---|---|---|---|
| 0h | | | | | | | | | | |
| 48h | | | | | | | | | | |
| 96h | | | | | | | | | | |
| 144h | | | | | | | | | | |
| 192h | | | | | | | | | | |
| 240h | | | | | | | | | | |
| 288h | | | | | | | | | | |
| 336h | | | | | | | | | | |
| 384h | | | | | | | | | | |
| 432h | | | | | | | | | | |
| 480h | | | | | | | | | | |
| 528h | | | | | | | | | | |
| 576h | | | | | | | | | | |
| 624h | | | | | | | | | | |
| 672h | | | | | | | | | | |

Fig. 7

| SALT SPRAY TIME | INV 2 | COM 4 |
|---|---|---|
| 0h | | |
| 48h | | |
| 96h | | |
| 144h | | |
| 192h | | |
| 240h | | |
| 288h | | |
| 336h | | |
| 384h | | |
| 432h | | |

ZN-MG ALLOY PLATED STEEL MATERIAL HAVING EXCELLENT CORROSION RESISTANCE AND PLATING ADHESION

TECHNICAL FIELD

The present disclosure relates to a Zn—Mg alloy plated steel material having excellent corrosion resistance and plating adhesion.

BACKGROUND ART

A zinc plating method, inhibiting corrosion of iron through cathodic protection, is excellent in anticorrosion performance and economic feasibility. Therefore, the zinc plating method has been widely used to prepare a steel material having excellent anticorrosion properties. A zinc-plated (galvanized) steel sheet has properties of sacrificial corrosion protection in which zinc, having lower oxidation-reduction potential than iron, is corroded earlier than iron to inhibit corrosion of the steel material when exposed to a corrosive environment. In addition thereto, zinc in a plated layer may form dense corrosion products on a surface of a steel sheet while being oxidized. Thus, the steel material may be blocked from an oxidizing environment to improve anticorrosion properties of the steel material.

However, air pollution and the worsening of other environmental pollution has been increasing, due to the proliferation of industrial activity, and regulations on resource and energy savings have been tightened. Accordingly, there is increasing need for development of a steel material having more excellent corrosion resistance than conventional zinc plated steel material, there have been various studies on Zn—Mg alloy plated steel material in a related art.

A Zn—Mg alloy plated steel sheet, already developed, suffers from many issues such as peeling-off in working, caused by poor adhesion to a parent material, and the like. In order to address such issues, various methods such as changing a composition of a plated layer, forming a plated layer having a multilayer structure, forming an adhesion layer between a plated layer and a parent material, and the like, have been proposed. Nonetheless, deterioration in plating adhesion is not addressed yet.

DISCLOSURE

Technical Problem

An aspect of the present disclosure is to provide a Zn—Mg alloy plated steel material securing excellent corrosion resistance and plating adhesion simultaneously.

However, aspects of the present disclosure are not limited thereto. Additional aspects will be set forth in part in the description which follows, and will be apparent from the description to those skilled in the art.

Technical Solution

According to an aspect of the present disclosure, a Zn—Mg alloy plated steel material includes a base steel material and first to third Zn—Mg alloy layers sequentially disposed on the base steel material. The first to third Zn—Mg alloy layers have a Zn single phase, a Mg single phase, a $MgZn_2$ alloy phase, and a $Mg_2Zn_{11}$ alloy phase. An area ratio of the $MgZn_2$ alloy phase, included in the first to third Zn—Mg alloy layers, is greater than an area ratio of the $Mg_2Zn_{11}$ alloy phase included in the first to third Zn—Mg alloy layers. An area ratio of a $MgZn_2$ alloy phase, included in each of the first to third Zn—Mg alloy layers, is greater than an area ratio of the $MgZn_2$ alloy phase included in the second Zn—Mg alloy layer.

Advantageous Effects

As described above, a Zn—Mg alloy plated steel material according to the present disclosure has more excellent corrosion resistance than a Zn plated steel material according to a related art and has excellent adhesion to base steel, a parent material, to be applied to, in detail, vehicles, home appliances, and the like.

The various and beneficial advantages and effects of the present disclosure are not limited to the above description, and can be more easily understood in the course of describing a specific embodiment of the present disclosure.

DESCRIPTION OF DRAWINGS

The above and other aspects, features and other advantages of the present disclosure will be more clearly understood from the following detailed description taken in conjunction with the accompanying drawings, in which:

FIG. 2 is an image observing surfaces of samples during a salt spray test;

FIG. 7 is an image observing surfaces of samples during a salt spray test of Inventive Example 2 and Comparative Example 4 (In FIG. 7, 'COM' and 'INV' denote 'Comparative Example' and 'Inventive Example', respectively).

BEST MODE FOR INVENTION

Figure 1:
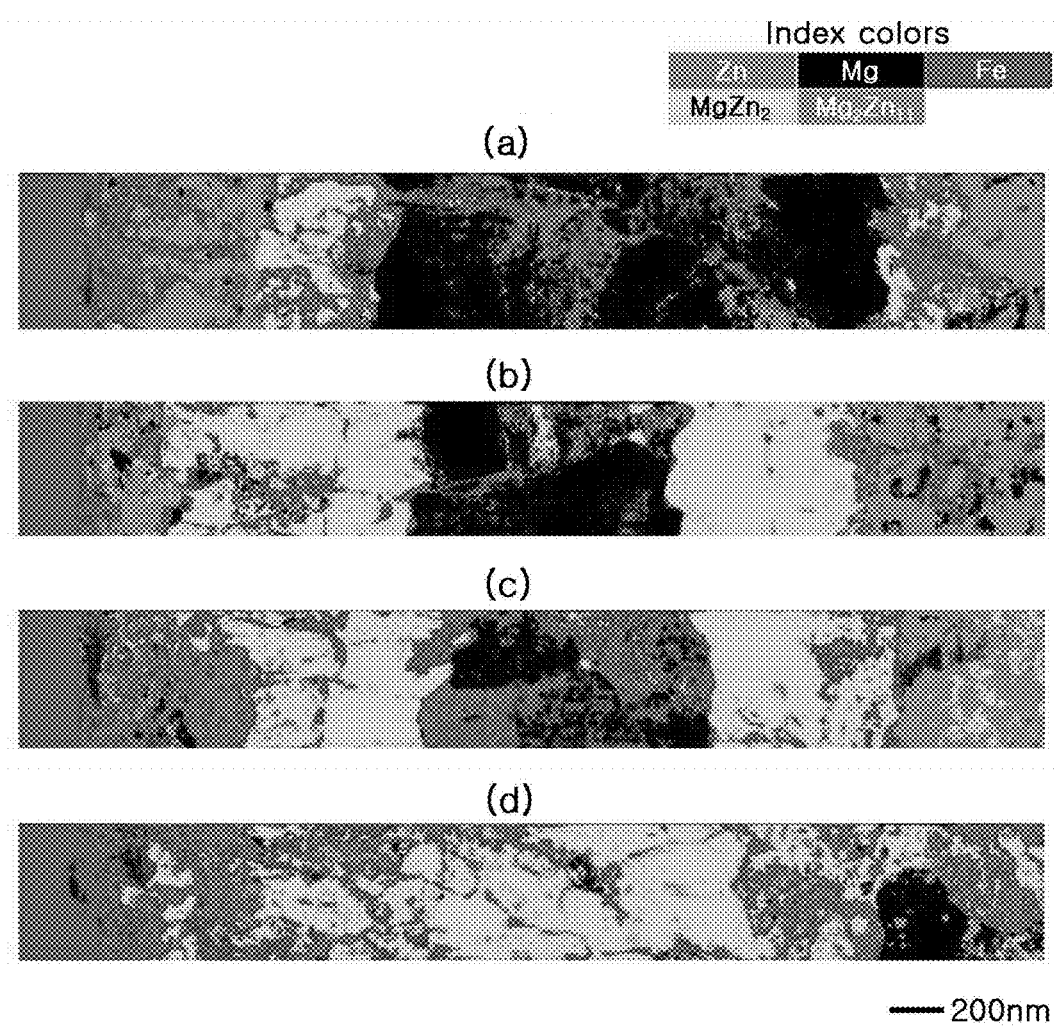
FIG. 1 is an image illustrating a structural distribution of a cross section of a plated steel material by TEM-ASTAR (In FIG. 1, 'CON', 'COM' and 'INV' denote 'Conventional Example', 'Comparative Example' and 'Inventive Example', respectively)

Hereinafter, a Zn—Mg alloy plated steel material, an aspect of the present disclosure, will be described in detail.

A Zn—Mg alloy plated steel material according to the present disclosure includes base steel and first to third Zn—Mg alloy layers disposed on the base steel. In the present disclosure, an alloy composition and a shape of the base steel are not limited and may be, for example, a steel sheet or a steel wire including C, Si, Mn, P, and S.

The first to third Zn—Mg alloy layers include a Zn single phase, a Mg single phase, a $MgZn_2$ alloy phase, and $Mg_2Zn_{11}$ alloy phase. The first to third Zn—Mg alloy layers may include other alloy phases in addition to the $Mg_2Zn_{11}$ alloy phase and the $MgZn_2$ alloy phase.

For example, each of the first to third Zn—Mg alloy layers has an alloyed region and an unalloyed region, and the unalloyed region remains as a Zn single phase or a Mg single phase. The Mg—Zn alloy phase has lower ductility than the Zn single phase and Mg single phase. Therefore, when the first to third Zn—Mg alloy layers include only the Mg—Zn alloy phase, they may peel off in working due to poor plating adhesion. In the present disclosure, since a Zn single phase or a Mg single phase may include a portion of an unalloyed region in the first to third Zn—Mg alloy layers, the Zn single phase or the Mg single phase may absorb a portion of a difference in strain in working. Thus, the plating adhesion may be improved.

Zn—Mg based alloy phases include a $Mg_2Zn_{11}$ alloy phase, a $MgZn_2$ alloy phase, a $MgZn_2$ alloy phase, a $MgZn_3$ alloy phase, $Mg_7Zn_3$ alloy phase, and the like. The present inventors have conducted research and found that, among the above phases, only the $Mg_2Zn_{11}$ alloy phase and the $MgZn_2$ alloy phase are effective in improving a steel material. However, when an alloyed region includes only a $Mg_2Zn_{11}$ alloy phase, gloss degradation, or the like, may occur. Meanwhile, when an alloyed region includes only a $MgZn_2$ alloy phase, the $MgZn_2$ alloy phase may peel off in working due to strong brittleness thereof. In this regard, in the present disclosure, an alloyed region in the first to third Zn—Mg alloy layers is formed to include a composite phase of a $Mg_2Zn_{11}$ alloy phase and a $MgZn_2$ alloy phase. In detail, an area ratio of the $MgZn_2$ alloy phase may be greater than an area ratio of the $Mg_2Zn_{11}$ alloy phase.

In detail, an area ratio of the $MgZn_2$ alloy phase, included in each of the first and third Zn—Mg alloy layers, may be greater than an area ratio of the $MgZn2$ alloy phase included in the second Zn—Mg alloy layer. As described above, when an alloy layer, in which a $MgZn_2$ alloy phase having strong brittleness is poor, is interposed between alloy layers in which a $MgZn_2$ alloy phase having strong brittleness is rich, plating adhesion may be improved.

According to an example, an area ratio of the $Mg_2Zn_{11}$ alloy phase, included in each of the first and third Zn—Mg alloy layers, may be smaller than an area ratio of the $Mg_2Zn_{11}$ alloy phase included in the second Zn—Mg alloy layer. As described above, when a large amount of $Mg_2Zn_{11}$ alloy phase having relatively excellent ductility is formed in the second Zn—Mg alloy layer interposed between alloy layers in which a $MgZn_2$ alloy phase having string brittleness is rich, plating adhesion may be further improved.

According to an example, the first to third Zn—Mg alloy layers may include, by an area ratio, more than 45% to 80% or less of a $MgZn_2$ alloy phase and an $Mg_2Zn_{11}$ alloy phase. A range of the area ratio may be, in further detail, 55% or more to 70% or less. When the area ratio of the $MgZn_2$ alloy phase and the $Mg_2Zn_{11}$ alloy phase is less than 45%, it may be difficult to obtain a sufficient corrosion resistance improvement effect. Meanwhile, when the area ratio of the $MgZn_2$ alloy phase and the $Mg_2Zn_{11}$ alloy phase is greater than 80%, the plating adhesion may be deteriorated due to the presence of the excessive Zn—Mg based alloy phase. The remainder may be a Zn phase, a Mg phase, other alloy phases, and the like.

In the present disclosure, a method of manufacturing the above-described Zn—Mg alloy plated steel material is not limited. As an example, the Zn-alloy plated steel material may be obtained by performing an alloying heat treatment at an appropriate temperature for appropriate time after sequentially forming a Zn plated layer, a Mg plated layer, and a Zn-plated layer on a base steel.

In this case, the Zn plating layer, formed directly on the base steel, may be formed by any known method such as hot-dip galvanizing, electro-galvanizing, vacuum deposition, or the like, but the other plating layers may be formed by, in detail, vacuum deposition. Prior to the vacuum deposition, a foreign object or a native oxide film on the surface may be removed using, in detail, plasma, ion beam, or the like. The vacuum deposition method may be an electron beam method, a sputtering method, a thermal evaporation method, an induction heating evaporation method, an ion plating method, electromagnetic levitation physical vapor deposition method, or the like.

During the vacuum deposition, the base steel may be controlled to be maintained at a temperature of approximately 100° C. or less. In detail, diffusion between the respective plated layers, caused by latent heat of solidification, may be controlled to be inhibited by giving sufficient cooling time between processes of forming the plated layers.

Meanwhile, alloying heat treatment temperature and time may vary depending on a heating method, a heating rate, a cooling rate, a thickness of each of the plating layers, and the like, and are not limited in the present disclosure.

A ratio of weight of the Mg plated layer to total weight of all of the plated layers may be controlled to be, in detail, 0.08 to 0.12. When the weight ratio of the Mg plated layer is excessively low, a $MgZn_2$ alloy phase may not be formed. Meanwhile, when the weight ratio of the Mg plated layer is excessively high, a MgZn alloy phase, a $Mg_7Zn_3$ alloy phase, and the like, may be formed to be mixed in the alloy layer.

MODE FOR INVENTION

In the description below, an example embodiment of the present disclosure will be described in greater detail. It should be noted that the exemplary embodiments are provided to describe the present disclosure in greater detail, and to not limit the present disclosure.

Embodiment

Base steel was placed inside a chamber having a degree of vacuum maintained at $10^{-5}$ Torr or less, and a Zn plated layer, a Mg plated layer, and a Zn plated layer were sequentially formed by physical vapor deposition (PVD).

Figure 4:
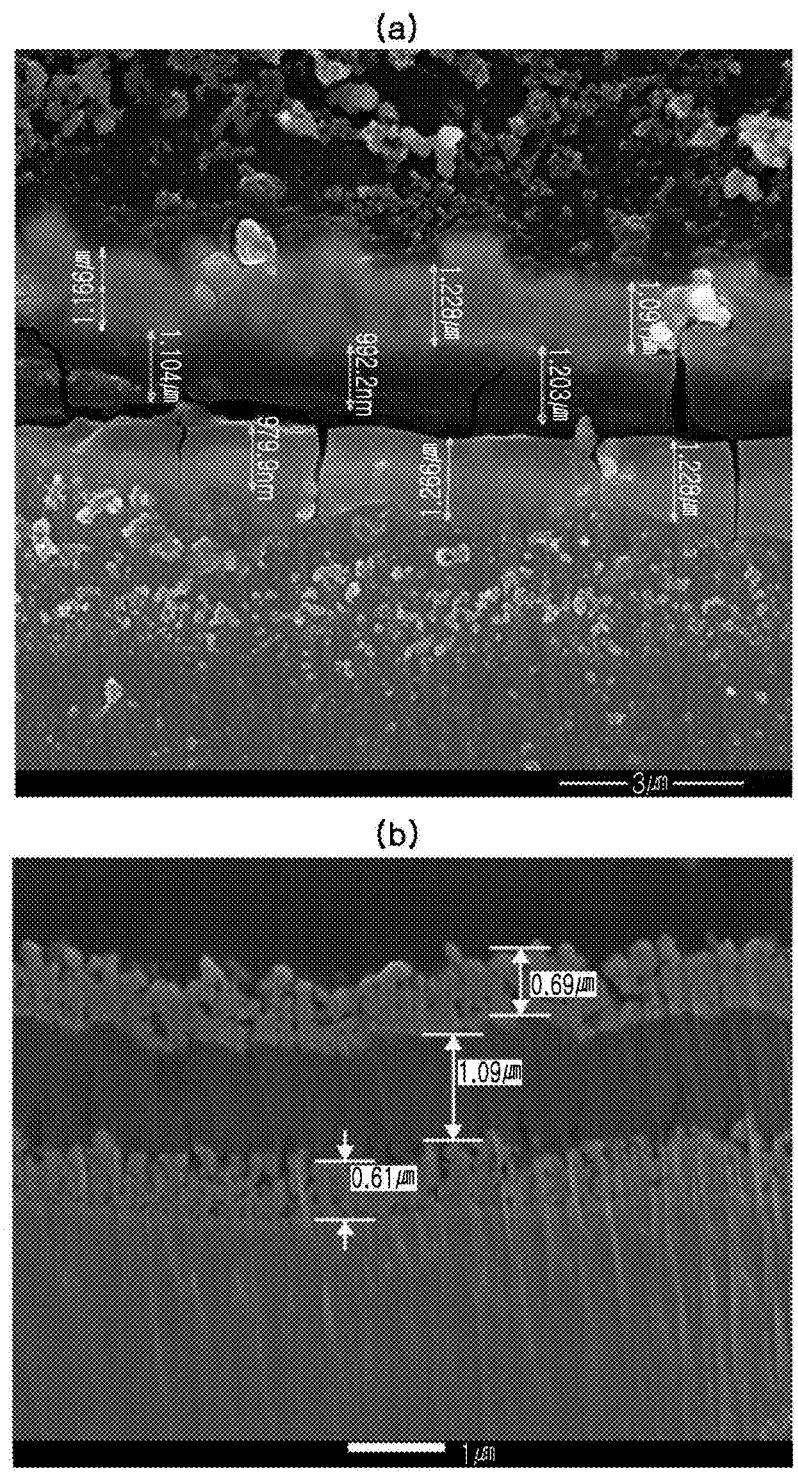
FIG. 4 is an image observing a cross section of a stacked sample of a plated layer according to an example embodiment of the present disclosure.

FIG. 4 is an image observing a cross section of the manufactured plated layer. In the case of Comparative Examples 1 to 3, Comparative Examples 5 to 9, and Inventive Example 1 of Table 1, each plated layer had a thickness of approximately μm as shown in (a) of FIG. 4. In the case of Inventive Example 1 and Comparative Example 4, a Zn plated layer was formed to have a thickness of approximately 0.6 to 0.7 μm, and a Mg plated layer was formed to have a thickness of approximately 1 μm, as shown in (b) of FIG. 4.

Then, an additional heat source was not supplied to base steel during formation of the respective plated layers, and sufficient cooling time was given during formation of the respective plated layers to prevent diffusion between the respective plated layers caused by latent heat of solidification. After an atmosphere temperature in the chamber was increased to 200° C. at a rate of 30° C./sec to perform an alloying heat treatment, the respective plated layers were cooled to a room temperature at a rate of 10° C./sec. At this point, alloying heat treatment time (time at which the atmospheric temperature in the chamber was maintained at 200° C.) varied for each sample, and the result is listed in Table 1.

Figure 5:
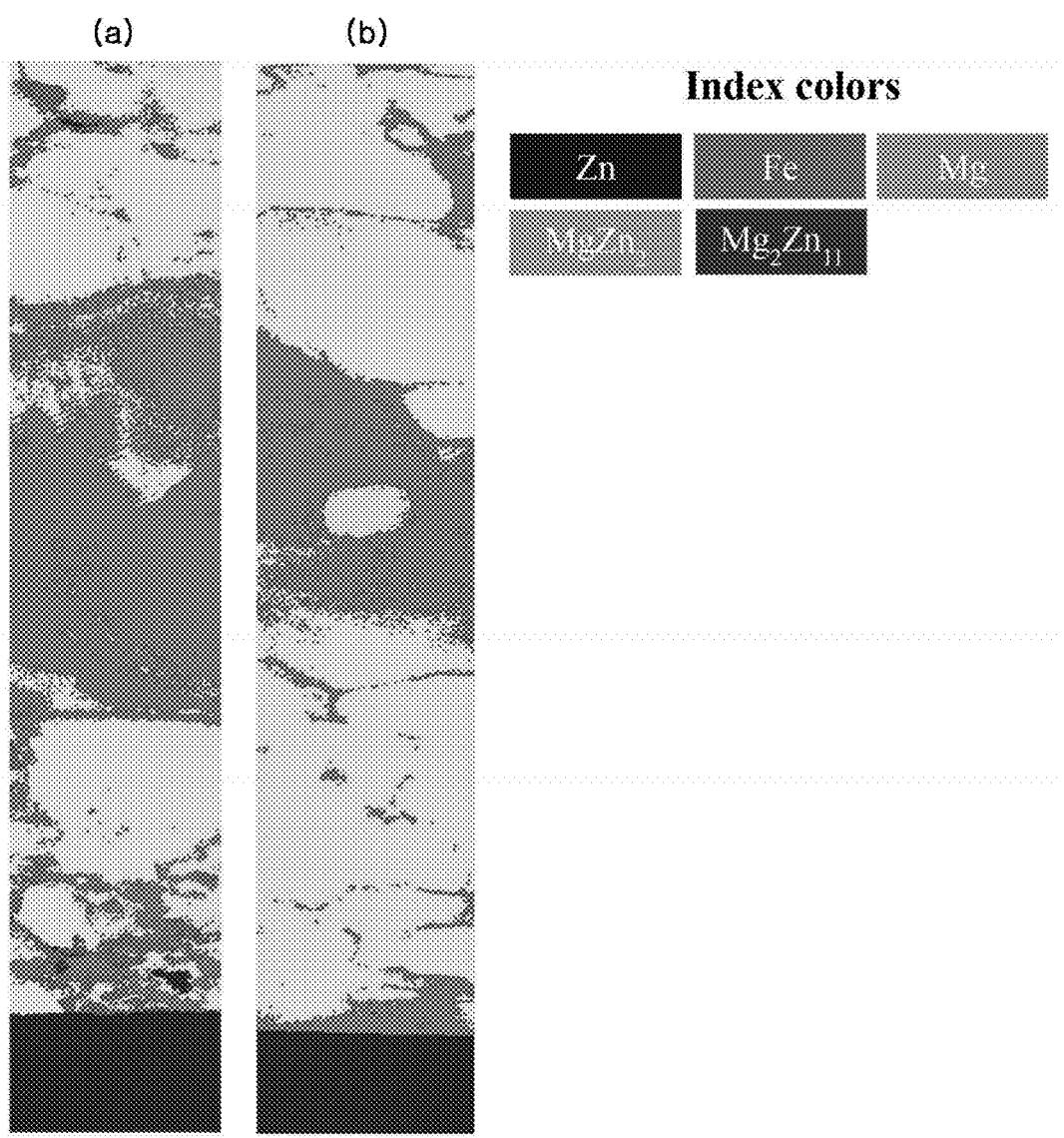
FIG. 5 is an image illustrating a structural distribution of a cross section of a plated steel material by TEM-ASTAR of Inventive Example 2 and Comparative Example 4.

For each example, area ratios of a Zn single phase, a Mg single phase, a MgZn2 alloy phase, and a Mg2Zn11 alloy phase, included in first to third Zn—Mg alloy layers, were measured by a reference intensity ratio (RIR) method. The results are listed in Table 1. For some samples, structural distributions of cross sections of alloy layers were analyzed by a TEM-ASTAR (JEM 2100F) method. FIG. 1 is an image illustrating a structural distribution of a cross section of a plated steel material by TEM-ASTAR. In FIG. 1, (a) to (d) are images of Comparative Example 1, Comparative Example 3, Inventive Example 1, and Comparative Example 6, respectively. In FIG. 5, (a) and (b) are images of Inventive Example 2 and Comparative Example 4, respectively.

Then, corrosion resistance and plating adhesion of each example were evaluated. Detailed evaluation methods and criteria will be described below.

1. Evaluation of Corrosion Resistance

Each sample entered a salt spray tester (TS-CASS) and red rust occurrence time was measured based on the international standard (ASTM B117). In this case, 5% of salt water (temperature of 35° C., pH 7) was used. A pressure of compressed air was set to 0.1 MPa, and the salt water was sprayed at 1.5 ml/80c$^2$ per hour. An internal temperature of a chamber, in which the sample was disposed, was set to 35° C., the same as the temperature of the salt water. Edges of each sample were sealed with an adhesive tape (Nitto tape) such that corrosion, developed from the edges of each sample, might be prevented to evaluate corrosion resistance of only a plated layer. When the red rust occurrence time was greater than 300 hours, the corrosion resistance was evaluated to be excellent. When the red rust occurrence time was greater than 200 hours to less than 300 hours, the corrosion resistance was evaluated to be poor. The results are listed in Table. FIG. 2 is an image observing surfaces of samples during a salt spray test. In FIG. 2, a star mark (★) represents a point at which red rust, occupying 5% of an exposed area, occurs. In FIG. 2, Conventional Example represents a conventional electro-galvanized steel material (one-side coating weight 25 g/m$^2$). Test results of samples of Inventive Example 2 and Comparative Example 4, not illustrated in FIG. 2, are illustrated in FIG. 7.

2. Evaluation of Plating Adhesion

Figure 3:
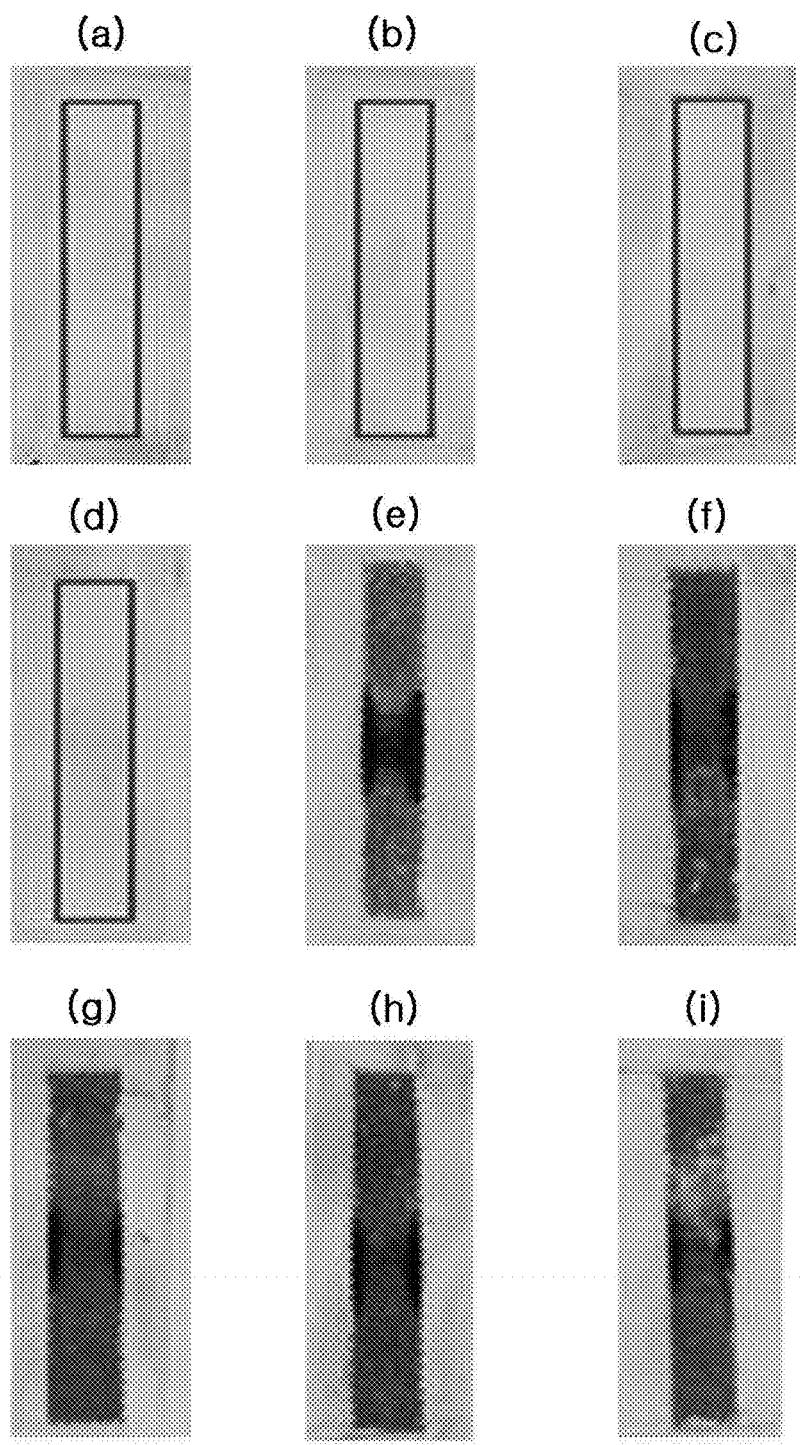
FIG. 3 is an image observing surfaces of samples after a bending test.
Figure 6:
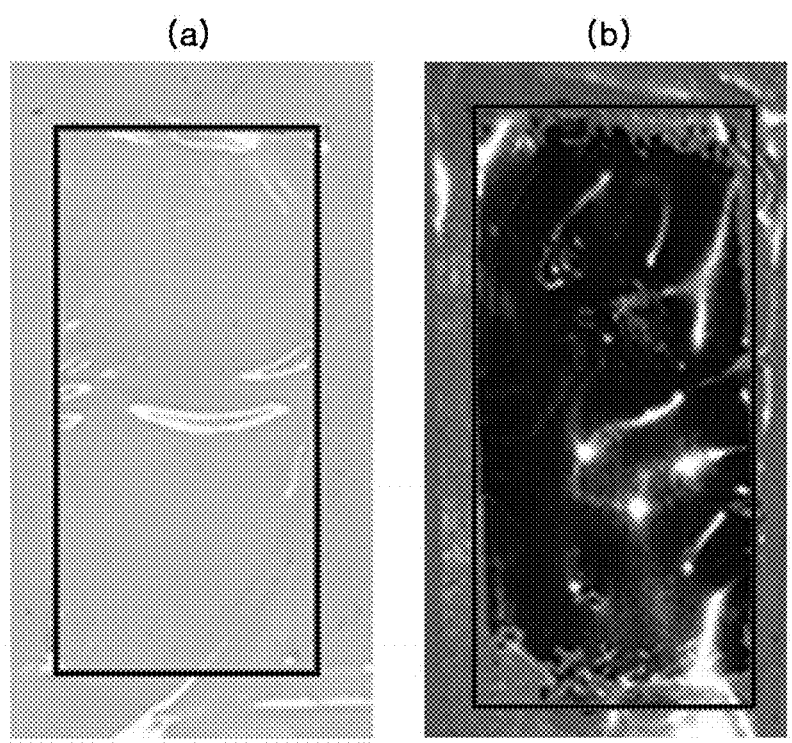
FIG. 6 is an image observing surfaces of samples after a bending test of Inventive Example 2 and Comparative Example 4.

Each sample was bent at an angle of 180°, and was then subjected to a bending test. An adhesive tape (Nitto tape) was attached to an entire bent portion of each sample and was then removed therefrom. When an alloy layer did not adhere to the adhesive tape at all, the plating adhesion was evaluated to be excellent. When an alloy layer adhered to the adhesive tape, the plating adhesion was evaluated to be poor. The results are listed in Table 1. FIG. 3 is an image observing surfaces of samples after a bending test. In FIG. 3, (a) to (i) are surface images of Comparative Example 1, Comparative Example 2, Comparative Example 3, Inventive Example 1, Comparative Example 5, Comparative Example 7, Comparative Example 8, and Comparative Example 9, respectively. In FIGS. 6, (a) and 6 (b) are images of Inventive Example 2 and Comparative Example 4 after a bending test, respectively.

TABLE 1

| | Heating | Structure Fraction (area %) | | | | Corrosion Resistance | | | |
| --- | --- | --- | --- | --- | --- | --- | --- | --- | --- |
| No. | Treatment Time (sec) | MgZn$_2$ Alloy Phase | Mg$_2$Zn$_{11}$ Alloy Phase | Zn Single Phase | Mg Single Phase | Red Rust Occurrence Time (hr) | Evaluation | Adhesion Evaluation | Note |
| 1 | 0 | 3 | 19 | 46 | 42 | 144 | Poor | Excellent | CE1 |
| 2 | 20 | 5.9 | 19.8 | 42.6 | 31.7 | 288 | Normal | Excellent | CE2 |
| 3 | 80 | 9 | 31 | 34 | 26 | 288 | Normal | Excellent | CE3 |
| 4 | 120 | 44 | 19 | 21 | 16 | 336 | Excellent | Excellent | IE1 |
| 5 | 140 | 66.3 | 25.1 | 4 | 4.6 | 336 | Excellent | Excellent | IE2 |
| 6 | 160 | 69.3 | 23.8 | 2 | 5 | 336 | Excellent | Poor | CE4 |
| 7 | 240 | 74 | 11 | 7 | 8 | 432 | Excellent | Poor | CE5 |
| 8 | 360 | 91 | 9 | 0 | 0 | 624 | Excellent | Poor | CE6 |
| 9 | 480 | 90 | 10 | 0 | 0 | 672 | Excellent | Poor | CE7 |
| 10 | 600 | 87 | 13 | 0 | 0 | 672 | Excellent | Poor | CE8 |
| 11 | 720 | 87 | 13 | 0 | 0 | 672 | Excellent | Poor | CE9 |

IE: Inventive Example,
CE: Comparative Example

From Table 1, it can be seen that in the case of Inventive Examples 1 and 2 in which heat treatment times were controlled to be 120 seconds and 140 seconds, a structure fraction was appropriately controlled, and both corrosion resistance and plating adhesion were excellent. From (c) of FIG. 1 and (a) of FIG. 5, it can be visually seen that an area ratio of a MgZn$_2$ alloy phase, included in each of the first and third Zn—Mg alloy layers, is greater than an area ratio of a MgZn$_2$ alloy phase, included in the second Zn—Mg alloy layer, and an area ratio of a Mg$_2$Zn$_{11}$ alloy phase, included in each of the first and third Zn—Mg layers, is smaller than an area ratio of a Mg$_2$Zn$_{11}$ alloy phase included in the second Zn—Mg alloy layer.

Meanwhile, Comparative Examples 1 to 9 were poor in corrosion resistance and/or plating adhesion. This was because a structure fraction in the entire alloy layer was not appropriately controlled or a structure fraction of each alloy layer was not appropriately controlled.

While example embodiments have been shown and described above, the scope of the present disclosure is not limited thereto, and it will be apparent to those skilled in the art that modifications and variations could be made without departing from the scope of the present disclosure as defined by the appended claims.

The invention claimed is:

1. A Zn—Mg alloy plated steel material comprising:
a base steel material; and
first to third Zn—Mg alloy layers sequentially disposed on the base steel material,
wherein the first to third Zn—Mg alloy layers have a Zn single phase, a Mg single phase, a MgZn$_2$ alloy phase, and a Mg$_2$Zn$_{11}$ alloy phase,
an area ratio of the MgZn$_2$ alloy phase, comprised in the first to third Zn—Mg alloy layers, is greater than an area ratio of the Mg$_2$Zn$_{11}$ alloy phase comprised in the first to third Zn—Mg alloy layers, and
an area ratio of a MgZn$_2$ alloy phase, comprised in each of the first and third Zn—Mg alloy layers, is greater than an area ratio of the MgZn$_2$ alloy phase comprised in the second Zn—Mg alloy layer.

2. The Zn—Mg alloy plated steel material of claim 1, wherein an area ratio of the $Mg_2Zn_{11}$ alloy phase, comprised in each of the first and third Zn—Mg alloy layers, is smaller than an area ratio of the $Mg_2Zn_{11}$ alloy phase included in the second Zn—Mg alloy layer.

3. The n-Mg alloy plated steel material of claim 1, wherein the first to third Zn—Mg alloy layers comprise, by an area ratio, more than 45% to 80% or less of a $MgZn_2$ alloy phase and an $Mg_2Zn_{11}$ alloy phase.

4. The Zn—Mg alloy plated steel material of claim 1, wherein an average content of Mg, comprised in the first and third Zn—Mg alloy layers, is 8 to 12% by weight.

\* \* \* \* \*